United States Patent
Horii

(10) Patent No.: US 6,630,387 B2
(45) Date of Patent: Oct. 7, 2003

(54) METHOD FOR FORMING CAPACITOR OF SEMICONDUCTOR MEMORY DEVICE USING ELECTROPLATING METHOD

(75) Inventor: Hideki Horii, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/812,407

(22) Filed: Mar. 19, 2001

(65) Prior Publication Data

US 2001/0055851 A1 Dec. 27, 2001

(30) Foreign Application Priority Data

Jun. 13, 2000 (KR) ......................................... 2000-32392

(51) Int. Cl.⁷ ................................................. H01L 21/20
(52) U.S. Cl. ........................ 438/396; 438/399; 438/674; 438/677; 438/253; 438/256
(58) Field of Search ................................ 438/396, 399, 438/674, 677, 253, 256

(56) References Cited

U.S. PATENT DOCUMENTS

| | | | |
|---|---|---|---|
| 5,244,833 A | * 9/1993 | Gansauge et al. | 216/13 |
| 5,620,583 A | 4/1997 | Kuhn et al. | |
| 5,789,320 A | * 8/1998 | Andricacos et al. | 438/678 |
| 6,045,678 A | * 4/2000 | Morse et al. | 205/123 |
| 6,136,707 A | * 10/2000 | Cohen | 438/687 |
| 6,228,759 B1 | * 5/2001 | Wang et al. | 438/625 |
| 6,255,187 B1 | * 7/2001 | Horii | 438/396 |
| 6,271,127 B1 | * 8/2001 | Liu et al. | 438/638 |
| 6,277,720 B1 | * 8/2001 | Doshi et al. | 438/586 |
| 6,410,418 B1 | * 6/2002 | Yang et al. | 438/626 |
| 6,489,235 B2 | * 12/2002 | Gilton et al. | 438/643 |

FOREIGN PATENT DOCUMENTS

| | | |
|---|---|---|
| KR | 1996-053824 | 11/1996 |
| KR | 1998-0021066 | 6/1998 |

OTHER PUBLICATIONS

English Abstract of Korean Application No. 1996–053824.
English Abstract of Koran Application No. 1998–0021066.

* cited by examiner

Primary Examiner—Amir Zarabian
Assistant Examiner—Christy Novacek
(74) Attorney, Agent, or Firm—Marger Johnson & McCollom, P.C.

(57) ABSTRACT

A method of forming a capacitor of a semiconductor memory device is provided. In the capacitor formation, a insulating layer is deposited over a semiconductor substrate, and patterned into a insulating pattern with a hole that exposes the semiconductor substrate. Next, a seed layer for use in forming a lower electrode is formed over the surface of the exposed semiconductor substrate, the inner walls of the hole, and the insulating pattern, and a plating mask layer is selectively formed on the seed layer deposited on the insulating pattern, and on a portion of the seed layer from the upper edges of the insulating pattern deposited along the sidewalls of the hole to a predetermined depth, such that the seed layer formed in the hole is exposed. The plating mask layer is formed by a physical vapor deposition (PVD) or a plasma chemical vapor deposition (CVD) method. Next, a conductive layer is formed on the exposed seed layer by electroplating, and then etched to form a conductive pattern and a seed pattern separated by a unit cell. The insulating pattern formed on the outer walls of the hole is removed to complete a lower electrode of the capacitor formed of the conductive pattern. Then, a dielectric layer and an upper electrode are formed in succession on the lower electrode. Accordingly, the lower electrode conductive pattern can be formed just in a hole with a high aspect ratio by the electroplating, without occurrence of a void in the hole.

26 Claims, 5 Drawing Sheets

METHOD FOR FORMING CAPACITOR OF SEMICONDUCTOR MEMORY DEVICE USING ELECTROPLATING METHOD

This application claims priority from Korean Application No. 2000-32392, filed on Jun. 13, 2000, in the name of Samsung Electronics Co., Ltd., and is incorporated herein by reference for all purposes.

BACKGROUND OF THE INVENTION

1. Field of the Invention

The present invention relates to a method for forming a capacitor of a semiconductor memory device, and more particularly, to a method for forming a capacitor of a semiconductor memory device.

2. Description of the Related Art

A decrease in cell capacitance due to a reduction in memory cell areas makes it difficult to increase the integration density of semiconductor memory devices. Such decreased cell capacitance degrades the data readability from memory cells, increases a soft error rate, and also hinders the low-voltage operation of the semiconductor memory devices. Thus, the problem of decreased cell capacitance needs to be solved for ultra large-scale integrated, semiconductor memory devices.

To increase capacitance within a limited cell area, a method of thinning a dielectric layer of a capacitor or a method of forming a capacitor lower electrode with a cylindrical or pin-like structure so as to increase the effective area of a capacitor has been suggested. However, as for 1 gigabyte-or-more dynamic random access memories (DRAMs), with an existing dielectric layer formed of a nitride/oxide (NO) layer with bilayered structure, or a tantalum oxide layer, it is difficult to obtain a desired capacitance that is high enough to operate the memory device by the above suggested methods.

To solve this problem, research into use of a dielectric layer with a high dielectric constant, which is formed of, for example, $(Ba,Sr)TiO_3(BST)$, $PbZrTiO_3(PZT)$ and $(Pb,La)(Zr,Ti)O_3(PLZT)$, as a dielectric layer of a capacitor is being actively conducted.

For example, in fabricating a semiconductor memory device having a dielectric layer with a high dielectric constant, a lower electrode pad is formed of doped polysilicon in an impurity injection region of a semiconductor substrate. After forming a plug, which is electrically connected to a lower electrode pad, a capacitor lower electrode is formed on the plug. A dielectric layer with a high dielectric constant, or a ferroelectric layer is formed on the capacitor lower electrode as a capacitor dielectric layer, and then subjected to annealing at high temperatures in an oxygen atmosphere to crystalize the capacitor dielectric layer. As a result, the insulation characteristics of the capacitor dielectric layer is enhanced with increased capacitance and reduced leakage current of the capacitor. However, since the high-temperature annealing process is carried out at a temperature of 600–900° C. under the oxygen atmosphere, if the capacitor lower electrode is formed of doped polysilicon, which is a well-known electrode material, then the capacitor lower electrode can oxidize during the high-temperature annealing process, thereby degrading contact resistance, or resulting in an unnecessary metal silicide layer between the capacitor dielectric layer and the capacitor lower electrode.

To avoid this problem, when a capacitor of a semiconductor memory device has a dielectric layer with a high dielectric constant, a platinum (Pt) group element, or an oxide of these elements, for example, Pt, iridium (Ir), ruthenium (Ru), ruthenium oxide ($RuO_2$) or iridium oxide ($IrO_2$), is typically used as an electrode material.

According to a conventional technique of forming a lower electrode with a Pt group element, a conductive layer is formed of a Pt group element and then patterned by dry etching to form the lower electrode. However, the dry etching method does not allow easy change of the Pt group element of the conductive layer into a gaseous form, and thus it is difficult to divide the lower electrode for individual cells. For example, when fabricating 4 gigabytes or more semiconductor memory devices having, in particular, a lower electrode with 300 nm or less width, the dry etching method has a limitation in forming the lower electrode. Thus, it would be desirable to provide a method suitable for forming a capacitor lower electrode, other than the dry etching method.

SUMMARY OF THE INVENTION

It is an objective of the present invention to provide a method for forming a capacitor of a semiconductor memory device by an electroplating method, rather than by a dry etching method.

To achieve the objective of the present invention, there is provided a method for forming a capacitor of a semiconductor memory device, comprising depositing a insulating layer over a semiconductor substrate, and patterning the insulating layer into a insulating pattern with a hole, which exposes the semiconductor substrate. The insulating pattern determines the dimension of a lower electrode.

Next, a seed layer is formed over the surface of the exposed semiconductor substrate, the inner walls of the hole, and the insulating pattern, and a plating mask layer is selectively formed on the seed layer deposited on the insulating pattern, and on a portion of the seed layer from the upper edges of the insulating pattern deposited along the sidewalls of the hole to a predetermined depth, such that the seed layer formed in the hole is exposed. The seed layer is formed of a conductive material to be used as an electrode for electroplating. The seed layer may be formed of a platinum group metal layer, a platinum group metal oxide layer, a conductive material layer with perovskite structure, a conductive metal layer, a metal silicide layer, a metal nitride layer, or a multi-layer of these layers. The plating mask layer may be formed of an insulating material such that it can be protected from deposition of a metal layer during electroplating. The plating mask layer may be selectively formed on the seed layer deposited on the insulating pattern, and on a portion of the seed layer from the upper edges of the insulating pattern deposited along the sidewalls of the hole to a predetermined depth, by a physical vapor deposition (PVD) or a plasma chemical vapor deposition (CVD) method, such that the seed layer formed in the hole can be exposed.

Next, a conductive layer is formed on the exposed seed layer by electroplating, filling the hole. When forming the conductive layer, a metal salt solution containing a Pt salt, Ir salt, Ru salt, Rh salt, Os salt, Pd salt, Au salt, Ag salt, Co salt, Ni salt or a composite salt of these metal salts can be used as a plating solution; Pt, Ir, Ru, Rh, Os, Pd, Au, Ag, Co, Ni or an alloy of these metals can be used as an anode; and the seed layer can be used as a cathode.

Next, the surfaces of the plating mask layer, the seed layer and the conductive layer are etched to be flat by, for example, a dry etching method or a chemical mechanical polishing (CMP) method, thereby forming a conductive pattern and a seed pattern separated by a unit cell. The insulating pattern formed on the outer walls of the hole is removed to complete a lower electrode of the capacitor formed of the conductive pattern. Then, a dielectric layer and an upper electrode are formed in succession on the lower electrode, thereby completing a capacitor.

In the formation of a capacitor of a semiconductor device according to the present invention, the conductive pattern to be a lower electrode can be formed just in a hole with a high aspect ratio by electroplating, without generation of a void in the hole, not by a dry etching method.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

Figure 1:
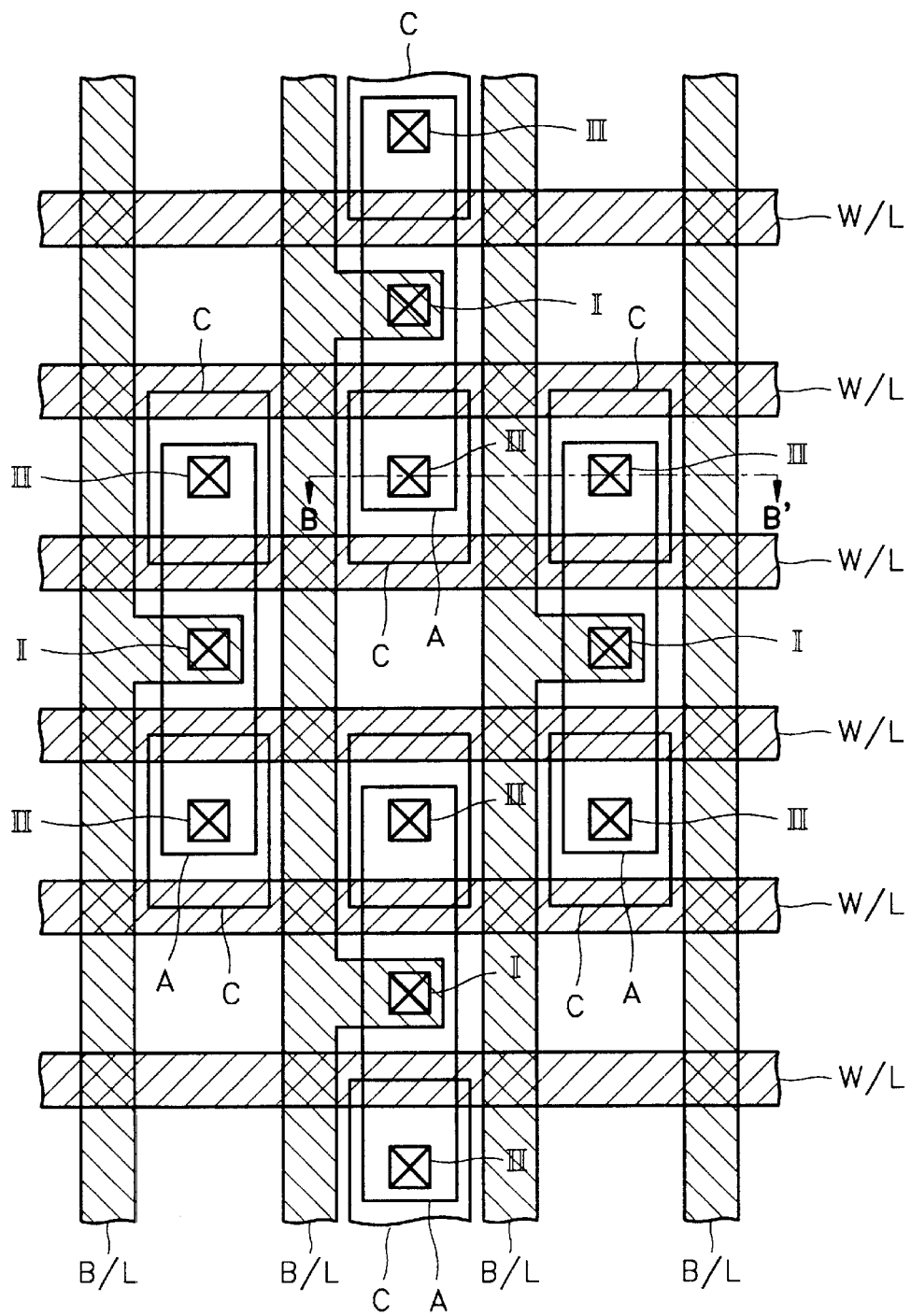
FIG. 1 is a layout diagram of a semiconductor memory device to which a capacitor formation method by electroplating according to the present invention is applied.

The present invention will now be described more fully with reference to the accompanying drawings, in which a preferred embodiment of the invention is shown. This invention may, however, be embodied in many different forms and should not be construed as being limited to the embodiment set forth herein. Rather, the embodiment is provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. It is also noted that like reference numerals may be used to designate identical or corresponding parts throughout the drawings.

FIG. 1 is a layout of a semiconductor memory device to be fabricated in accordance with one embodiment of the present invention using a capacitor formation method by electroplating. As shown in FIG. 1, active regions A are defined by an isolation layer, and two word lines W/Ls overlap the active regions A. Bit lines B/Ls are arranged perpendicular to the word lines W/Ls at a different level or elevation. A bit line contact I is formed in the drain region of an active region A, and lower electrode contacts II are formed in the source region of the active region A. A capacitor lower electrode C of the semiconductor memory device is formed over each of the lower electrode contacts II.

FIGS. 2 through 8 are cross-sectional views taken along line B–B' of FIG. 1, illustrating a method for forming a capacitor of the semiconductor memory device. Although the present embodiment is described with reference to a capacitor over bit-line (COB) structure, as shown in FIGS. 2 through 8, it is appreciated that the present invention is applicable to a capacitor under bit-line (CUB) structure.

Figure 2:
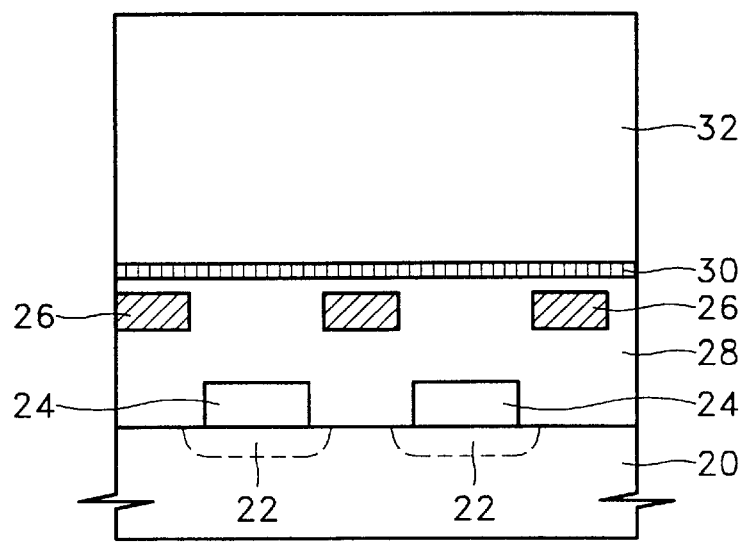
FIGS. 2 through 8 are cross-sectional views taken along line B–B' of FIG. 1, illustrating a method for forming a capacitor of a semiconductor memory device according to the present invention.

Referring to FIG. 2, an etch stop layer 30 is formed over a semiconductor substrate 20 on which one or more lower electrode pads 24, one or more bit lines 26 and an interlayer dielectric (ILD) film 28 have been formed. Here, the semiconductor substrate 20 may be formed of Si, GaAs or InP or other suitable material.

The lower electrode pad 24 to be connected to a lower electrode of the capacitor is formed immediately above an impurity region 22 adjacent the surface of the semiconductor substrate 20. Those of skill in the art will understand that electrode pad 24 is optional, and may not be required. The lower electrode pad 24 is formed of metal silicide, metal nitride, doped polysilicon, or a multi-layer of these or other suitable layers. For example, the metal silicide layer may be a $WSi_x$, $TiSi_x$, $MoSi_x$, $CoSi_x$ or $TaSi_x$ layer, and the metal nitride layer may be a TiN, TaN, WN, TiSiN, TiAlN, TiBN, ZrSiN, ZrAlN, MoSiN, MoAlN, TaSiN or TaAlN layer.

The ILD film 28, which electrically isolates adjacent lower electrode pads 24, is formed with a thickness of approximately 300–700 nm, preferably with a thickness of approximately 400 nm. The ILD film 28 is formed of silicon oxide. The etch stop layer 30, which acts as an etch barrier layer during etching of a insulating pattern, is formed with a thickness of approximately 3–30 nm, preferably with a thickness of approximately 5 nm. The etch stop layer 30 may be a single layer of $SiN_x$, $SiON_x$, $TiON_x$, $AlO_x$, $AlN_x$, $TaO_x$ or $ZrO_x$, or a multi-layer of these or other suitable layers. In one preferred embodiment, the etch stop layer 30 is formed of silicon nitride by chemical vapor deposition (CVD).

Next, an insulating layer 32 is formed over the etch stop layer 30. The thickness of the insulating layer 32 is varied according to the dimension of the capacitor's lower electrode. In the present embodiment, the insulating layer 32 is formed with a thickness of approximately 400–1500 nm, and preferably with a thickness of approximately 600 nm. The insulating layer 32 may be a single layer of boro-phospho-silicate glass (BPSG), spin-on glass (SOG), phospho-silicate glass (PSG), $SiO_x$, $SiN_x$, $SiON_x$, $TiO_x$, $AlO_x$ or $AlN_x$, or a multi-layer of these or other suitable layers.

The insulating layer 32 may be formed by sputtering, CVD, physical vapor deposition or atomic layer deposition. The method used to form the insulating layer 32 varies depending on the material selected for the insulating layer 32. For example, if silicon oxide is selected as a material for the insulating layer 32, it is preferable to apply a CVD technique in forming the insulating layer 32.

Figure 3:
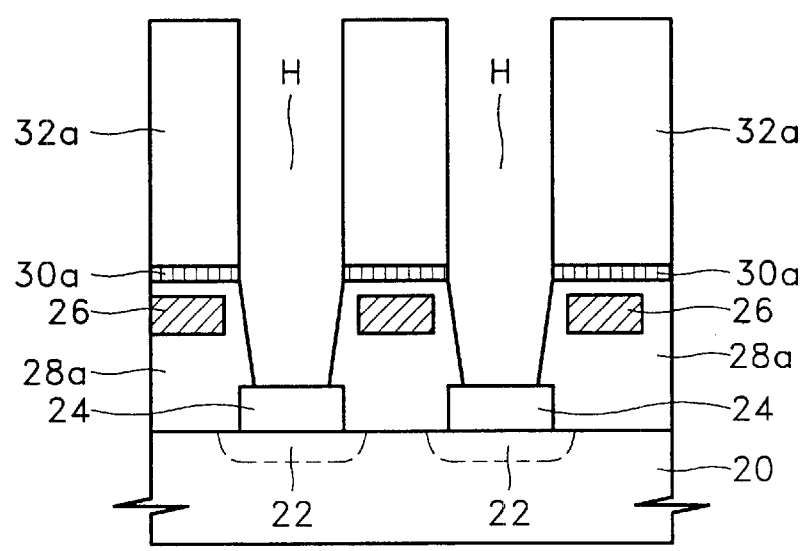

Referring to FIG. 3, a photoetching process is applied to the resultant structure of FIG. 2. In particular, the insulating layer 32, the etch stop layer 30 and the ILD film 28, which are formed generally above the lower electrode pad 24, are selectively patterned by a reactive ion etching (RIE) method, thereby forming a insulating pattern 32a, and an etch stop pattern 30a, an ILD pattern 28a, which collectively define a hole H through which the lower electrode pad 24 is exposed. The sidewalls of the insulating pattern 32a and the ILD pattern 28a are also exposed by the hole H, as illustrated. If the lower electrode pad 24 is omitted, the semiconductor substrate 20 is exposed through the hole H. The hole H corresponds to a portion of the lower electrode contact II to be formed as shown in FIG. 1. The hole H is used to form a plug and a lower electrode, which will be described later.

As shown in FIG. 3, one or more holes H for forming the lower electrodes and the plugs are simultaneously formed. When a spacer of the bit line 26 which corresponds to a portion of the ILD pattern 28a in contact with the sidewalls of the bit line 26, and a capping layer of the bit line 26 which corresponds to a portion of the ILD pattern 28a formed on the bit line 26 are formed of a material different from that used for the insulating pattern 32a, the holes H may be formed in a self-aligning manner.

Figure 4:
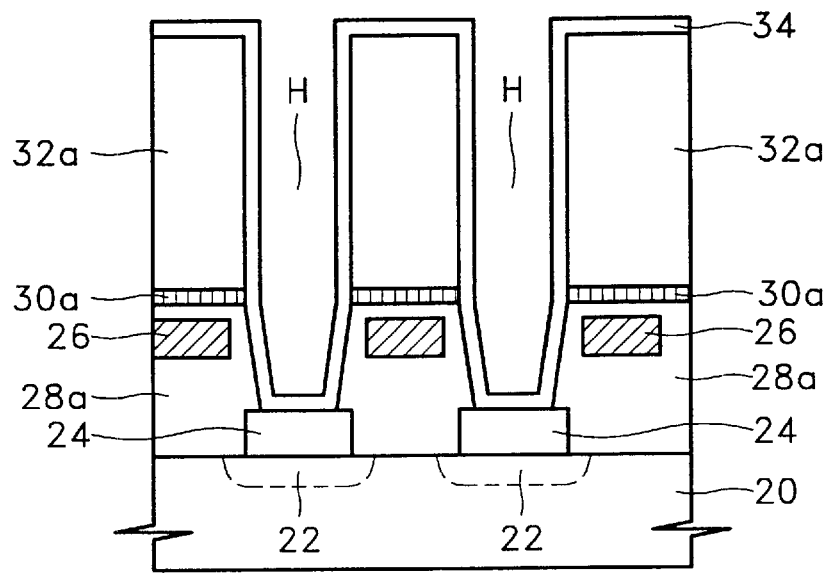

Referring to FIG. 4, a seed layer 34 for use in forming a lower electrode is formed on the bottom and sidewalls of the hole H and on the top of the insulating pattern 32a with a thickness of approximately 5–30 nm, and preferably with a thickness of approximately 20 nm. In other words, the seed layer 34 is formed over the top of the lower electrode pad 24, the surrounding sidewalls of the hole H and the top of the insulating pattern 32a. It will be appreciated that where a given lower electrode pad 24 is omitted, the seed layer 34 would be formed on the top of the semiconductor substrate 20 exposed through the hole H, rather than on the top of the lower electrode pad 24.

The seed layer 34 can be formed of any conductive material suitable for realizing the present invention. For example, the seed layer 34 can be a Pt group metal layer, a Pt group metal oxide layer, a conductive material layer with perovskite structure, a conductive metal layer, a metal silicide layer, a metal nitride layer, or a multi-layer of these or other suitable layers. For example, the Pt group metal layer may be a Pt, rhodium (Rh), iridium (Ir), osmium (Os) or palladium (Pd) layer, and the Pt group metal oxide layer may be a $PtO_x$, $RhO_x$, $RuO_x$, $IrO_x$ or $OsO_x$, $PdO_x$ layer. The conductive material layer with perovskite structure may be a $CaRuO_3$, $SrRuO_3$, $BaRuO_3$, $BaSrRuO_3$, $CaIrO_3$, $SrIrO_3$, $BaIrO_3$ or $(La,Sr)CoO_3$ layer, and the conductive metal layer may be a copper (Cu), aluminum (Al), tantalum (Ta), molybdenum (Mo), tungsten (W), gold (Au) or silver (Ag) layer. The metal silicide layer may be a $WSi_x$, $TiSi_x$, $CoSi_x$, $MoSi_x$ or $TaSi_x$ layer, and the metal nitride layer may be a TiN, TaN, WN, TiSiN, TiAlN, TiBN, ZrSiN, ZrAlN, MoSiN, MoAlN, TaSiN or TaAlN layer. Those of skill in the art will appreciate that lists are not exhaustive or exclusive and are not intended to limit in any way the scope of the invention as claimed.

In particular, the metal nitride layer can serve as an excellent diffusion barrier layer capable of preventing diffusion of silicon and metal, and can improve adhesion to metal layer. Thus, for example, if the seed layer 34 is formed of a multi-layer with a metal nitride layer, such as a TiN layer, and a Pt group metal layer formed on the metal nitride layer, such as a Ru layer, the adhesion of the seed layer 34 to the insulating pattern 32a and the ILD pattern 28a can be enhanced.

The seed layer 34 is preferably formed by a CVD method or a long-through-sputter (LTS) method, which is known to provide excellent step coverage. For example, if a Pt layer is selected as a material for the seed layer 34, it is preferable to use the CVD or LTS method in forming the seed layer 34. Alternatively, if a Ru layer is selected as a material for the seed layer 34, it is preferable to apply the CVD method in forming the seed layer 34. In this case, in forming the seed layer 34 of a Ru layer by the CVD method, bis (ethylcyclopentadienyl) ruthenium ($Ru(E_rC_p)_2$) may be used as a source gas and the flow rate of $O_2$ gas may be adjusted to preferably approximately 200 seem, and the temperature of a wafer preferably may be in the range of approximately 300–400° C.

Figure 5:
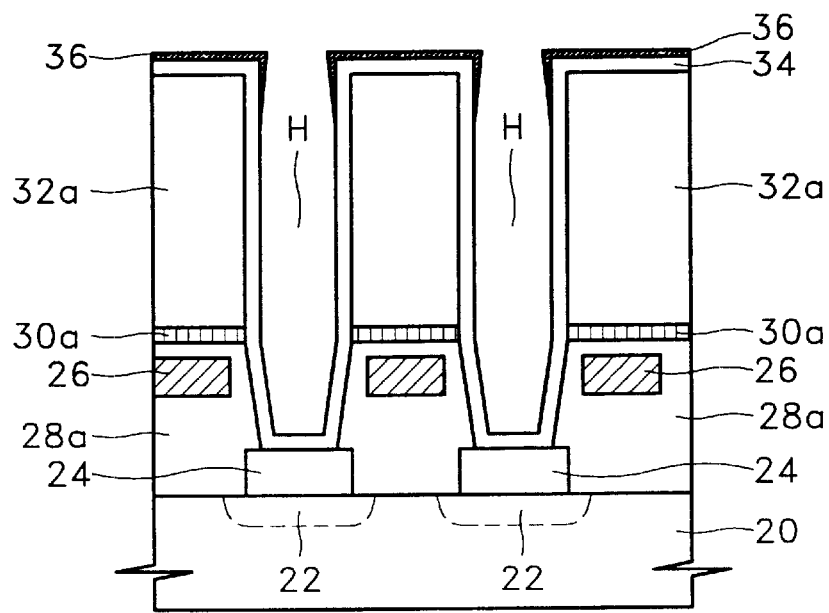

Referring to FIG. 5, a plating mask layer 36 is selectively deposited on the seed layer 34 formed on the top of the insulating pattern 32a and along the edges of the seed layer 34 down to a predetermined depth, such that a predetermined lower extent of the seed layer 34 formed on the surrounding sidewalls of the hole H remain exposed, as illustrated. The plating mask layer 36 preferably has a thickness of approximately 1–30 um. The plating mask layer 36 acts as an insulating layer, so that deposition of a metal layer over the plating mask layer 26 is prevented during electroplating. The plating mask layer 36, which is selectively formed on a portion of the seed layer 34 may be a single layer of $SiO_x$, $SiN_x$, $SiON_x$, $TiO_x$, $AlO_x$, $AlN_x$, $TaO_x$, $ZrO_x$, or other suitable layers, or a multi-layer of these layers or other suitable layers. Those skilled in the art will appreciate that the predetermined depth preferably is less than the predetermined lower extant of the seed layer 34, leaving sufficient exposed sidewall within holes H for electroplating.

The plating mask layer 36 may be formed of silicon oxide or silicon nitride by PVD, for example, by a reactive sputtering method, or of $SiO_x$, $SiN_x$, $SiON_x$, $TiO_x$, $AlO_x$, $AlN_x$, $ZrO_x$ or other suitable material by a plasma CVD or other suitable method. Due to poor step coverage of the PVD process, when PVD is used to deposit the plating mask layer 36 along the hole H, which is small, with a high aspect ratio as in illustrated embodiment of the present invention, the plating mask layer 36 can be deposited on the surface and only an upper sidewall portion, rather than through the entire sidewalls, of the seed layer 34 formed over the insulating pattern 32a. When a plasma CVD process is used to form the plating mask layer 36, the plating mask layer 36 can be deposited on the same portions of the seed layer 34, for the same reason as in use of the PVD process.

Figure 6:
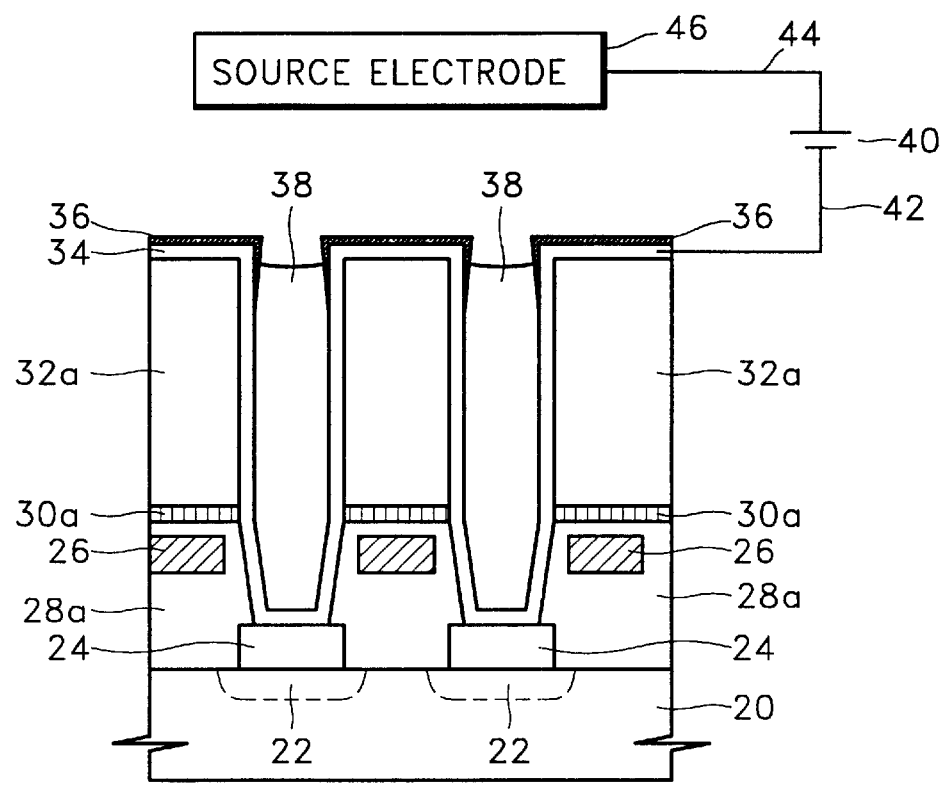

Referring to FIG. 6, a conductive layer 38 is formed in the hole H by electroplating. In particular, the cathode of a power source 40 is connected via a first wire 42 to the seed layer 34, while the anode of the power source 40 is connected via a second wire 44 to a source electrode 46. In this state, the semiconductor substrate 20 is dipped in a plating solution for electroplating. Further description of the plating solution is described below. Then, on the exposed surface of the seed layer 34 in the hole H, a metal that is substantially the same as the metal of the source electrode 46 is deposited, thereby forming the conductive layer 38 in the hole H. Here, the conductive layer 38 is selectively deposited on substantially only the exposed seed layer 34 in the hole H, not on the plating mask layer 36.

Furthermore, since the plating mask layer 36 is selectively formed on the surface of the seed layer 34 which overlies the insulating pattern 32a and along the sidewalls of the seed layer 34 down to a predetermined depth, localized deposition of excess conductive material at the edges of the insulating pattern 32a is prevented, so that no void occurs in the hole H. In other words, by use of an electroplating technique in forming the conductive layer 38 in the hole H, voids in the hole, which are caused with the conventional CVD and PVD methods, are avoided.

The conductive layer 38 may be a single layer of Pt, fr, Ru, Rh, Os, Pd, Cu, Ag, Au, Ni, Co, or other suitable material, or a multi-layer of these materials. For example, when Pt is selected as a material for the conductive layer 38, it is preferable that an ammonium platinum nitride ($Pt(NH_3)_2(NO_2)_2$) solution is used as a plating solution, and a Pt electrode is selected as the source electrode 46. In this case, the temperature of a plating bath may be set in the range of approximately 0–95° C., preferably at 80° C., the concentration of the ammonium platinum nitride ($Pt(NH_3)_2(NO_2)_2$) plating solution may be in the rage of approximately 1 to 20 g/l, preferably at approximately 10 g/l, pH of the plating solution may be in the range of approximately 0.5–9.0, preferably at approximately 1.0, the concentration of a conductive sulfuric acid in the plating solution may be in the range of approximately 0.5–1.5 g/l, the current density may be in the range of approximately 0.2–3 A/cm$^2$, but preferably at approximately 1 (A/cm$^2$) and the plating time may be in the range of approximately 50–800 seconds, preferably approximately 150 seconds.

When the conductive layer 38 preferably is formed of Pt, an ammonium chloroplatinate ((NH$_4$)$_2$PtCl$_6$) or chloroplatinic acid (H$_2$PtCl$_6$) solution can be used as the electroplating solution.

It is appreciate that instead of Pt, other metal salts can be incorporated into the electroplating solution. For this case, the hole H can be filled with the metal corresponding to the metal salt of the electroplating solution. The electroplating solution may contain a Pt, Ir, Ru, Rh, Os, Pd, Cu, Ag, Au, Ni or Co salt, or a composite salt of these or other suitable metal salts. For example, as the plating solution, (NH$_4$)$_2$PtCl$_6$, H$_2$PtCl$_6$, RuNOCl$_3$, RuCl$_3$, IrCl$_4$ or (NH$_4$)$_2$IrCl$_6$ can be used. The source electrode 46 preferably is formed of Pt, Ir, Ru, Rh, Os, Pd, Cu, Ag, Au, Ni or Co, or an alloy of these or other suitable metals.

Figure 7:
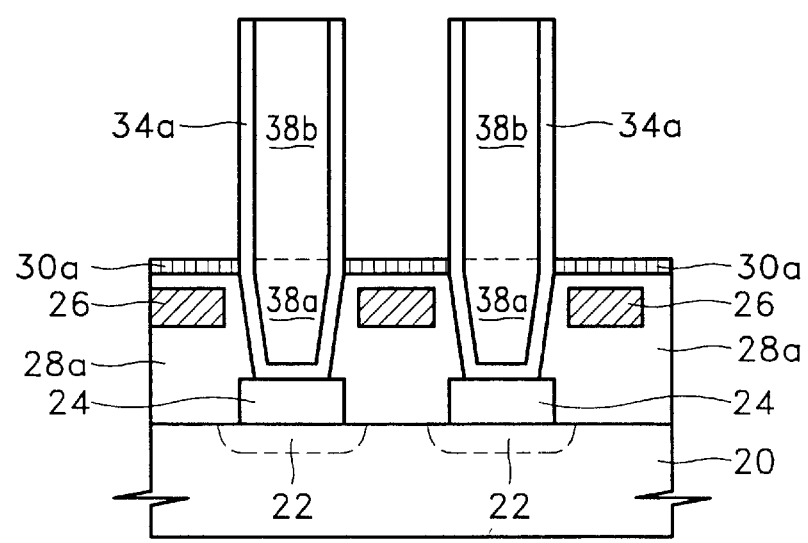

Referring to FIG. 7, the plating mask layer 36 and a portion of the seed layer 34 and the conductive layer 38 are removed by a predetermined thickness of approximately 50–200 nm, and preferably approximately 100 nm through dry etching or CMP, so that a seed pattern 34a and patterned conductive layers 38a and 38b are separated by a unit cell. The insulating pattern 32a of FIG. 6 is removed in a hydrofluoric acid (HF) solution by wet etching. When the insulating pattern 32a is etched by the wet etching, the seed pattern 34a is not removed, and the ILD pattern 28a is protected from etching by the etch stop pattern 30a. As a result, the patterned conductive layer 38a, which is hereinafter termed a plug, and the patterned conductive layer 38b, which is hereinafter termed a lower electrode of a capacitor, are formed, respectively, at the lower and upper locations of the hole H divided by dashed lines, as shown in FIG. 7. The plug 38a may be as high as approximately 200–800 nm. The lower electrode 38b on which a dielectric layer is to be formed by a subsequent process has a height of approximately 400–1500 nm. The width of the lower electrode 38b is determined by the size of the hole H, but typically is approximately 300 nm or less for ultra large-scale integrated semiconductor memory device. In FIG. 7, the seed pattern 34a is incorporated into the lower electrode 38b, but need not be incorporated into the same if necessary. The seed pattern 34a can be removed after the etching of the insulating pattern 32a.

Figure 8:
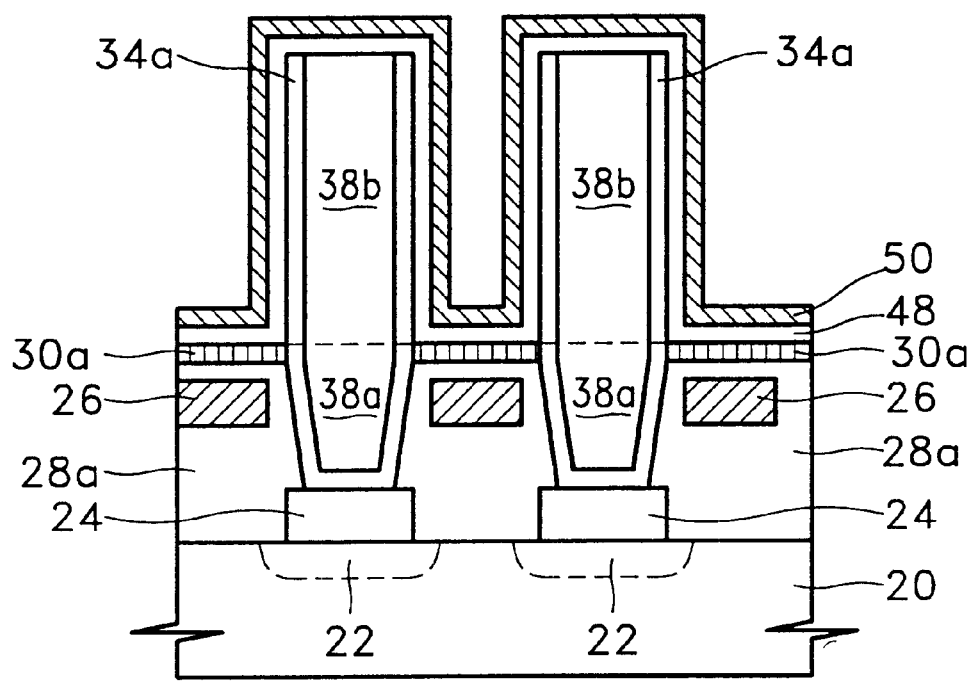

Referring to FIG. 8, a capacitor dielectric layer 48 is deposited, over the resultant structure of FIG. 7 having the lower electrode 38b, to a thickness of approximately 10–50 nm, and preferably to a thickness of approximately 30 nm. The dielectric layer 48 preferably is a Ta$_2$O$_5$, SiTiO$_3$(STO), (Ba,Sr)TiO$_3$(BST), PbZrTiO$_3$, SrBi$_2$Ta$_2$O$_5$(SBT), (Pb,La)(Zr,Ti)O$_3$ or Bi$_4$Ti$_3$O$_{12}$ layer, or a multi-layer of these or other suitable layers.

An upper electrode 50 is formed over the dielectric layer 48 with a thickness of approximately 30–150 nm, preferably and approximately 50 nm, by a sputtering or CVD method. The upper electrode 50 preferably comprises a material layer of substantially the same material as the material of the seed layer 34 for the lower electrode 38b.

Alternatively, the upper electrode 50 may comprises a Pt group metal layer, for example, a Pt layer, with application of a metal-organic deposition (MOD) method. In this case, if a spin coating technique is used to deposit the upper electrode 50 with a MOD solution, which typically is a mixture of 10% Pt-acetylacetonate and 90% ethanol, the thickness and the density of the Pt layer to become the upper electrode 50 can be controlled by varying the spin rate and the concentration of the Pt-MOD solution.

In addition, when the upper electrode 50 is formed of a Pt layer, a spin coating technique can be applied with a colloidal solution. In this case, a Pt colloidal solution with approximately 5% solid content by weight may be prepared by uniformly dispersing Pt colloidal particles having an average size of approximately 30–50 Å in an organic solvent such as alcohol. Then, the Pt colloidal solution may be spin coated to a thickness of approximately 1000 Å, and subjected to an annealing process at a temperature of approximately 300–500° C. for approximately 10 minutes to evaporate the alcoholic component from the deposited layer, so that the formation of upper electrode 50 of Pt layer is complete.

As previously mentioned, in the formation of a capacitor of a semiconductor device according to the present invention, a seed layer for electroplating is formed on the sidewalls of a hole that exposes the lower electrode pad, and on the surface of a insulating pattern. A plating mask layer is selectively deposited on the seed layer formed over the insulating pattern and in the sidewalls of the hole to a predetermined depth from the upper edges of the insulating pattern, such that a portion of the seed layer in the hole H is exposed. As a result, a patterned conductive layer for use as a lower electrode can be selectively deposited only in a hole typically having a high aspect ratio, without occurrence of voids in the hole. Therefore, a lower electrode conductive pattern having a width of approximately 300 nm or less for a highly-integrated semiconductor memory device can be obtained by the inventive electroplating method.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. A method for forming a capacitor of a semiconductor memory device, comprising:

depositing an insulating layer over a semiconductor substrate;

patterning the insulating layer into an insulating pattern with a hole that exposes the semiconductor substrate;

forming a seed layer over a surface of the exposed semiconductor substrate, side walls of the hole, and the insulating pattern;

selectively forming a plating mask layer on the seed layer where it overlies the insulating pattern, and on a top portion of the seed layer formed on the sidewalls of the hole, such that the seed layer formed on the sidewalls of the hole is substantially exposed;

forming a conductive layer on the exposed seed layer by electroplating;

etching the surfaces of the plating mask layer, the seed layer and the conductive layer in an upper generally planar surface thereto, thereby forming a conductive pattern and a seed pattern separated by a unit cell;

removing the insulating pattern formed on the outer walls of the hole, to complete a lower electrode of the capacitor formed of the conductive pattern; and forming a dielectric layer and an upper electrode in succession on the lower electrode.

2. The method of claim 1, wherein the insulating layer comprises a boro-phospho-silicate glass (BPSG) layer, a spin-on glass (SOG) layer, a phospho-silicate glass (PSG) layer, a $SiO_x$ layer, a $SiN_x$ layer, a $SiON_x$ layer, a $TiO_x$ layer, an $AlO_x$ layer, an $AlN_x$ layer, or a multi-layer of these layers.

3. The method of claim 1, wherein the seed layer comprises a platinum group metal layer, a platinum group metal oxide layer, a conductive material layer with perovskite structure, a conductive metal layer, a metal silicide layer, a metal nitride layer, or a multi-layer of these layers.

4. The method of claim 1, wherein the seed layer comprises a platinum (Pt) layer, a rhodium (Rh) layer, a iridium (Ir) layer, a osmium (Os) layer, a palladium (Pd) layer, a $PtO_x$ layer, a $RhO_x$ layer, a $RuO_x$ layer, a $IrO_x$ layer, a $OsO_x$ layer, a $PdO_x$ layer, a $CaRuO_3$ layer, a $SrRuO_3$ layer, a $BaRuO_3$ layer, a $BaSrRuO_3$ layer, a $CaIrO_3$ layer, a $SrIrO_3$ layer, a $BaIrO_3$ layer, a $(La,Sr)CoO_3$ layer, a copper (Cu) layer, an aluminum (Al) layer, a tantalum (Ta) layer, a molybdenum (Mo) layer, a tungsten (W) layer, a gold (Au) layer, a silver (Ag) layer, a $WSi_x$ layer, a $TiSi_x$ layer, a $CoSi_x$ layer, a $MoSi_x$ layer, a $TaS_x$ layer, a TiN layer, a TaN layer, a WN layer, a TiSiN layer, a TiAlN layer, a TiBN layer, a ZrSiN layer, a ZrAlN layer, a MoSiN layer, a MoAlN layer, a TaSiN layer, a TaAlN layer, or a multi-layer of these layers.

5. The method of claim 1, wherein the plating mask layer is formed by a physical vapor deposition (PVD) or a plasma chemical vapor deposition (CVD) method.

6. The method of claim 1, wherein the plating mask layer comprises a $SiO_x$ layer, a $SiN_x$ layer, a $SiON_x$ layer, a $TiO_x$ layer, an $AlO_x$ layer, an $AlN_x$ layer, a $TaO_x$ layer, a $ZrO_x$ layer, or a multi-layer of these layers.

7. The method of claim 1, wherein, in forming the conductive layer, a metal salt solution containing a Pt salt, Ir salt, Ru salt, Rh salt, Os salt, Pd salt, Au salt, Ag salt, Co salt, Ni salt or a composite salt of these metal salts is used as a plating solution; Pt, Ir, Ru, Rh, Os, Pd, Au, Ag, Co, Ni or an alloy of these metals is used as an anode; and the seed layer is used as a cathode.

8. The method of claim 1, wherein the lower electrode includes the seed pattern.

9. The method of claim 1, wherein the surfaces of the plating mask layer, the seed layer and the conductive layer are etched by a dry etching method or a chemical mechanical polishing (CMP) method.

10. The method of claim 1, wherein the dielectric layer is formed of a $Ta_2O_5$ layer, a $SiTiO_3$(STO) layer, a $(Ba,Sr)TiO_3$(BST) layer, a $PbZrTiO_3$ layer, a $SrBi_2Ta_2O_5$(SBT) layer, a $(Pb,La)(Zr,Ti)O_3$ layer, a $Bi_4Ti_3O_{12}$ layer, or a multi-layer of these layers.

11. The method of claim 1, wherein the upper electrode is formed by a sputtering method, a chemical vapor deposition (CVD) method, a metal-organic deposition (MOD) method, or a spin coating method with a colloidal solution.

12. A method for forming a capacitor of a semiconductor memory device, comprising:
    forming an interlayer dielectric (ILD) film over a semiconductor substrate having a lower electrode pad;
    forming an etch stop layer and an insulating layer in succession on the ILD film;
    patterning the insulating layer, the etch stop layer and the ILD film into an insulating pattern, an etch stop pattern and an ILD pattern that expose the lower electrode pad through a hole;
    forming a seed layer to be used in forming a lower electrode, on the surface of the exposed lower electrode pad, the inner walls of the hole, and the surface of the insulating pattern;
    selectively forming a plating mask layer on the seed layer deposited on the top of the insulating pattern, and a portion of the seed layer from the upper edges of the insulating pattern down to a predetermined depth, such that the seed layer formed in the hole is exposed;
    forming a conductive layer on the exposed seed layer by electroplating;
    etching the surfaces of the plating mask layer, the seed layer and the conductive layer to be flat, thereby forming a conductive pattern and a seed pattern separated by a unit cell;
    removing the insulating pattern formed on the outer walls of the hole, to complete a lower electrode of the capacitor formed of the conductive pattern; and
    forming a dielectric layer and an upper electrode in succession on the lower electrode.

13. The method of claim 12, wherein the lower electrode pad is formed of a metal silicide layer, a metal nitride layer, a doped polysilicon layer or a multi-layer of these layers.

14. The method of claim 12, wherein the lower electrode pad comprises a WSi layer, a $TiS_x$ layer, a $MoSi_x$ layer, a $CoSi_x$ layer, a $TaSi_x$ layer, a TiN layer, a TaN layer, a WN layer, a TiSiN layer, a TiAlN layer, a TiBN layer, a ZrSiN layer, a ZrAlN layer, a MoSiN layer, a MoAlN layer, a TaSiN layer, a TaAlN layer or a multi-layer of these layers.

15. The method of claim 12, wherein the etch stop layer comprises a $SiN_x$ layer, a $SiON_x$ layer, a $TiON_x$ layer, an $AlO_x$ layer, an $AlN_x$ layer, a $TaO_x$ layer, a $ZrO_x$ layer, or a multi-layer of these layers.

16. The method of claim 12, wherein the insulating layer comprises a boro-phospho-silicate glass (BPSG) layer, a spin-on glass (SOG) layer, a phospho-silicate glass (PSG) layer, a $SiO_x$ layer, a $SiN_x$ layer, a SiON, layer, a $TiO_x$ layer, an $AlO_x$ layer, an $AlN_x$ layer, or a multi-layer of these layers.

17. The method of claim 12, wherein the seed layer comprises a platinum group metal layer, a platinum group metal oxide layer, a conductive material layer with perovskite structure, a conductive metal layer, a metal silicide layer, a metal nitride layer, or a multi-layer of these layers.

18. The method of claim 12, wherein the plating mask layer is formed by a physical vapor deposition (PVD) or a plasma chemical vapor deposition (CVD) method.

19. The method of claim 12, wherein the plating mask layer comprises a $SiO_x$ layer, a $SiN_x$ layer, a $SiON_x$ layer, a $TiO_x$ layer, an $AlO_x$ layer, an $AlN_x$ layer, a $TaO_x$ layer, a $ZrO_x$ layer, or a multi-layer of these layers.

20. The method of claim 12, wherein, in forming the conductive layer, a metal salt solution containing a Pt salt, Ir salt, Ru salt, Rh salt, Os salt, Pd salt, Au salt, Ag salt, Co salt, Ni salt or a composite salt of these metal salts are dissolved is used as a plating solution; Pt, Ir, Ru, Rh, Os, Pd, Au, Ag, Co, Ni or an alloy of these metals is used as an anode; and the seed layer is used as a cathode.

21. The method of claim 12, wherein the lower electrode includes the seed pattern.

22. The method of claim 12, wherein the plating mask layer, and the surfaces of the seed layer and the conductive layer are etched by a dry etching method or a chemical mechanical polishing (CMP) method.

23. The method of claim 12, wherein the dielectric layer comprises a $Ta_2O_5$ layer, a $SiTiO_3$(STO) layer, a $(Ba,Sr)TiO_3$(BST) layer, a $PbZrTiO_3$ layer, a $SrBi_2Ta_2O_5$(SBT) layer, a $(Pb,La)(Zr,Ti)O_3$ layer, a $Bi_4Ti_3O_{12}$ layer, or a multi-layer of these layers.

24. A method for forming a semiconductor memory device, comprising:
    forming an insulating pattern on a semiconductor substrate, the insulating pattern including a hole that exposes the semiconductor substrate;

forming a seed layer over the exposed semiconductor substrate, sidewalls of the hole, and the insulating pattern;

selectively forming a plating mask layer on the seed layer where it overlies the insulating pattern, and on a top portion of the seed layer formed on the sidewalls of the hole, such that the seed layer formed on the sidewalls of the hole is substantially exposed;

forming a conductive layer on substantially only the exposed seed layer by electroplating; and planarizing the resulting structure to form a conductive pattern and a seed layer pattern separated by a unit cell;

substantially removing the insulating pattern to complete a lower electrode of a capacitor formed of the conductive pattern; and successively forming a dielectric layer and an upper electrode on the lower electrode.

25. A method for forming a semiconductor memory device, comprising:

forming an insulating pattern on a semiconductor substrate, the insulating pattern including a hole that exposes the semiconductor substrate;

forming a seed layer over the exposed semiconductor substrate, sidewalls of the hole, and the insulating pattern;

selectively forming a plating mask layer on the seed layer where it overlies the insulating pattern, and on a top portion of the seed layer formed on the sidewalls of the hole, such that the seed layer formed on the sidewalls of the hole is substantially exposed;

forming a conductive layer on substantially only the exposed seed layer;

planarizing the resulting structure to form a conductive pattern and a seed layer pattern separated by a unit cell;

substantially removing the insulating pattern to complete a lower electrode of a capacitor formed of the conductive pattern; and successively forming a dielectric layer and an upper electrode on the lower electrode.

26. The method of claim 25, wherein forming a conductive layer on the exposed seed layer comprises electroplating.

* * * * *

UNITED STATES PATENT AND TRADEMARK OFFICE
CERTIFICATE OF CORRECTION

PATENT NO. : 6,630,387 B2
DATED : October 7, 2003
INVENTOR(S) : Horii

It is certified that error appears in the above-identified patent and that said Letters Patent is hereby corrected as shown below:

Column 1,
Line 25, "integrated, semiconductor memory" should read -- integrated semicondocutor memory --.

Column 5,
Line 58, "of O$_2$gas may" should read -- of O$_2$ gas may --.
Line 59, "200 seem, and" should read -- 200 sccm, and --.

Column 6,
Line 2, "1-30 um. The" should read -- 1-30 nm. The --.
Line 52, "Pt, fr. Ru," should read -- Pt, Ir, Ru, --.

Column 9,
Line 19, "a TaS$_x$ layer," should read -- a TaSi$_x$ layer, --.

Column 10,
Line 19, "a TiS$_x$ layer," should read -- a TiSi$_x$ layer, --.
Line 31, "a SiON, layer," should read -- a SiON$_x$ layer, --.

Column 11,
Line 15, "of a capacitor" should read -- of the capacitor --.

Column 12,
Line 15, , "of a capacitor" should read -- of the capacitor --.

Signed and Sealed this

Twentieth Day of July, 2004

JON W. DUDAS
*Acting Director of the United States Patent and Trademark Office*